United States Patent [19]
Neu

[11] Patent Number: 5,196,744
[45] Date of Patent: Mar. 23, 1993

[54] PEAK CLIPPING CIRCUIT

[75] Inventor: Georges Neu, Mareil-Sur-Mauldre, France

[73] Assignee: Bull, S.A., France

[21] Appl. No.: 733,857

[22] Filed: Jul. 22, 1991

[30] Foreign Application Priority Data

Jul. 23, 1990 [FR] France .................. 90 09364

[51] Int. Cl.$^5$ .......................... H03K 5/08; H03K 5/00
[52] U.S. Cl. ............................. 307/540; 307/544
[58] Field of Search .............. 307/544, 545, 549, 550, 307/560, 564, 567, 568, 520, 540; 328/169, 171

[56] References Cited

U.S. PATENT DOCUMENTS

| | | | |
|---|---|---|---|
| 4,661,723 | 4/1987 | Masuda et al. | 307/540 |
| 4,786,961 | 11/1988 | Avery | 307/544 |
| 4,831,343 | 5/1989 | Baron | 331/116 R |

FOREIGN PATENT DOCUMENTS

| | | |
|---|---|---|
| 2015839 | 9/1979 | United Kingdom . |
| 2132447 | 7/1984 | United Kingdom . |

OTHER PUBLICATIONS

RCA Technical Note, TN No. 877, Feb. 12, 1971, pp. 1-2; Princeton, NJ. H. F. King, Dynamic Input Clamp For Integrated Circuit Gates.
Patent Abstracts of Japan, vol. 3 No. 135 (E-150) [47] Nov. 10, 1979, JP-A-54 112 156 (Kogyo Gijutsuin) Sep. 1, 1979.

*Primary Examiner*—William L. Sikes
*Assistant Examiner*—Sinh Tran
*Attorney, Agent, or Firm*—Kerkam, Stowell, Kondracki & Clarke

[57] ABSTRACT

A peak clipping circuit for an integrated circuit of the VLSI type is connected in parallel with the integrated circuit and includes a peak clipping transistor of the bipolar T type and a charge transistor M of the MOS type. The charge transistor has its gate connected to an input of a circuit device of the integrated circuit. The clipping circuit functions to minimize parasitic oscillations at the working level of the input signal.

4 Claims, 2 Drawing Sheets

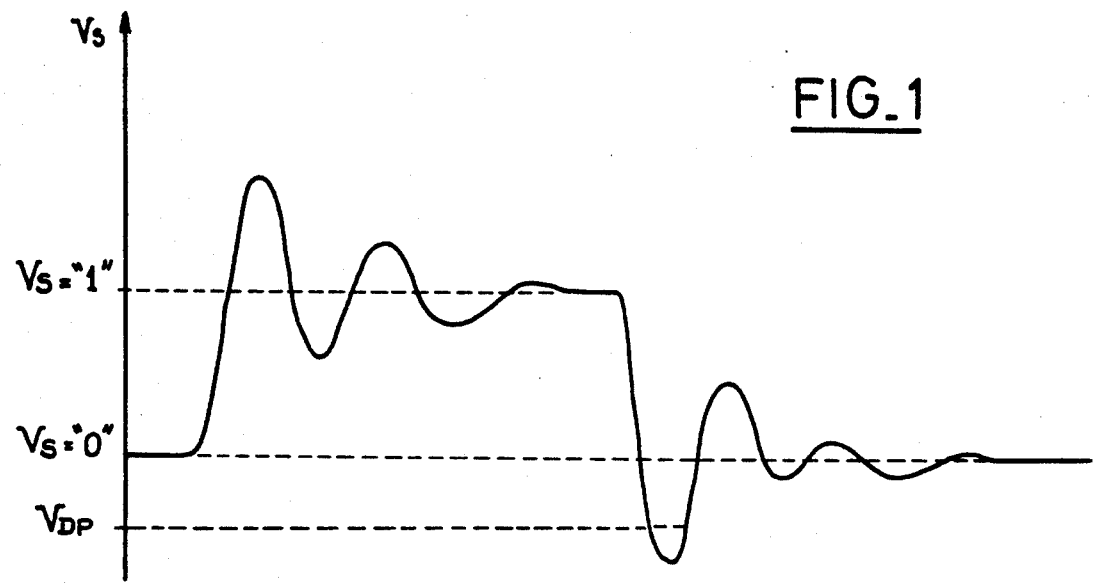
FIG_1
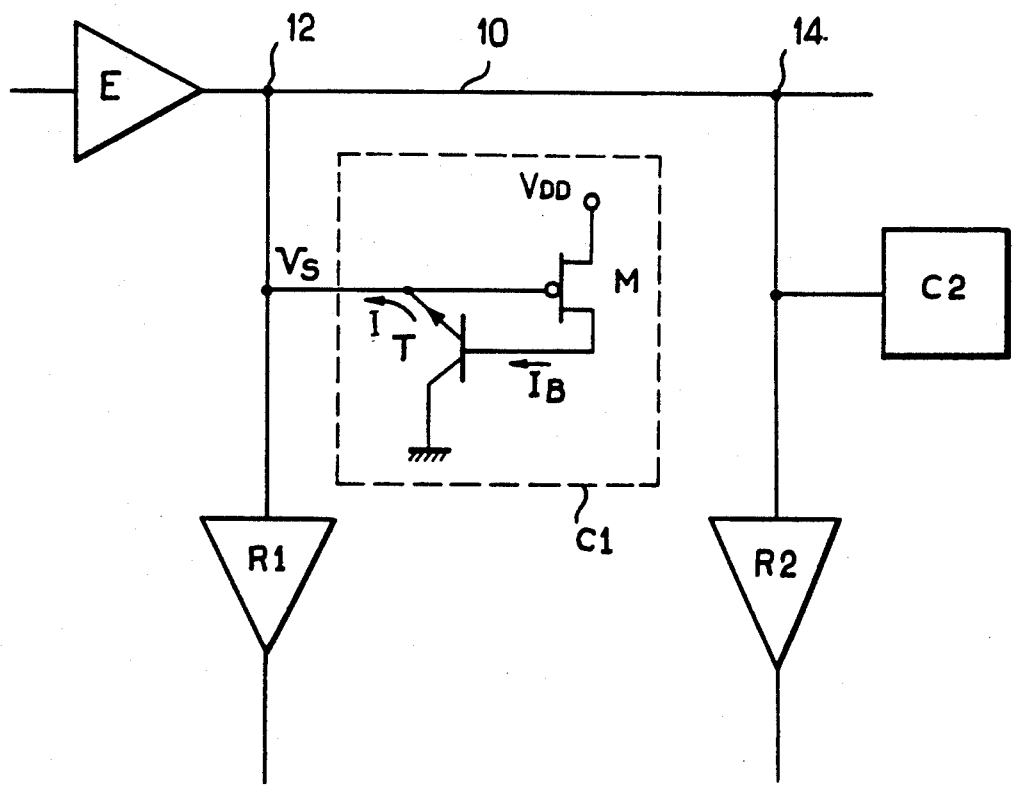
FIG_2

PEAK CLIPPING CIRCUIT the invention relates to a peak clipping circuit that can be used in particular at the input of integrated circuits of the VLSI (very large scale integration) type.

In transmissions between VLSI circuits, the signals are affected by the reflections on the transmission line, more precisely by the superoscillations provoked by the self-inductance of the VLSI circuit packages.

These superoscillations have amplitudes that increase progressively with the actual increase of the frequency used in the integrated circuits. The oscillations are particularly detrimental around the "low" level, in particular in circuits made by T2L technology, the tripping threshold of which is at 1.4 V.

In VLSI circuits, it is known to use diodes that clip the peaks of some of the parasitic oscillations to reduce their effects. However, this solution does not give full satisfaction, since present diodes do not begin to conduct except beyond a threshold voltage VBE on the order of 0.8 V. Schottky diodes are preferably used, having a voltage threshold VBE on the order of 0.4 V. However, the process of manufacture of Schottky diodes are expensive, and at present are nearly incompatible with MOS (metal oxide silicon) technology.

The object of the invention is to overcome this disadvantage and to propose a circuit that upon receiving a signal is capable in particular of absorbing practically the essence of parasitic superoscillations at one of the working levels ("low"/"0" or "high"/"1") of the signal.

To this end, the invention proposes a peak clipping circuit connected in parallel to the input of a receiver device, characterized in that it includes a peak clipping transistor of the bipolar T type, controlled by a charge transistor M of the MOS type, whose gate is connected to the input. Advantageously, the charge transistor M is of the PMOS type. This latter characteristic is used to eliminate "negative" parasitic voltages at the "low" level of the signal.

In a particular embodiment of the invention, a bipolar T transistor of the npn type has its emitter electrode connected to the input terminal of the receiver circuit and its collector electrode connected to ground of the circuit (zero reference voltage). The base electrode of transistor T is connected to the drain to the PMOS transistor M.

Such a circuit according to the invention is particularly valuable because it is simple in structure and easy to make, particularly in the form of BiCMOS circuits, and is compatible with T2L technology.

The characteristics and advantages of the invention will become more apparent from the ensuing detailed description taken in conjunction with the accompanying drawings, in which:

FIG. 1 shows the general course of a signal Vs appearing in a transmission line between two VLSI circuits not equipped with the peak clipping circuit of the invention;

FIG. 2 is a diagram of the peak clipping circuit according to the invention.

Figure 3:
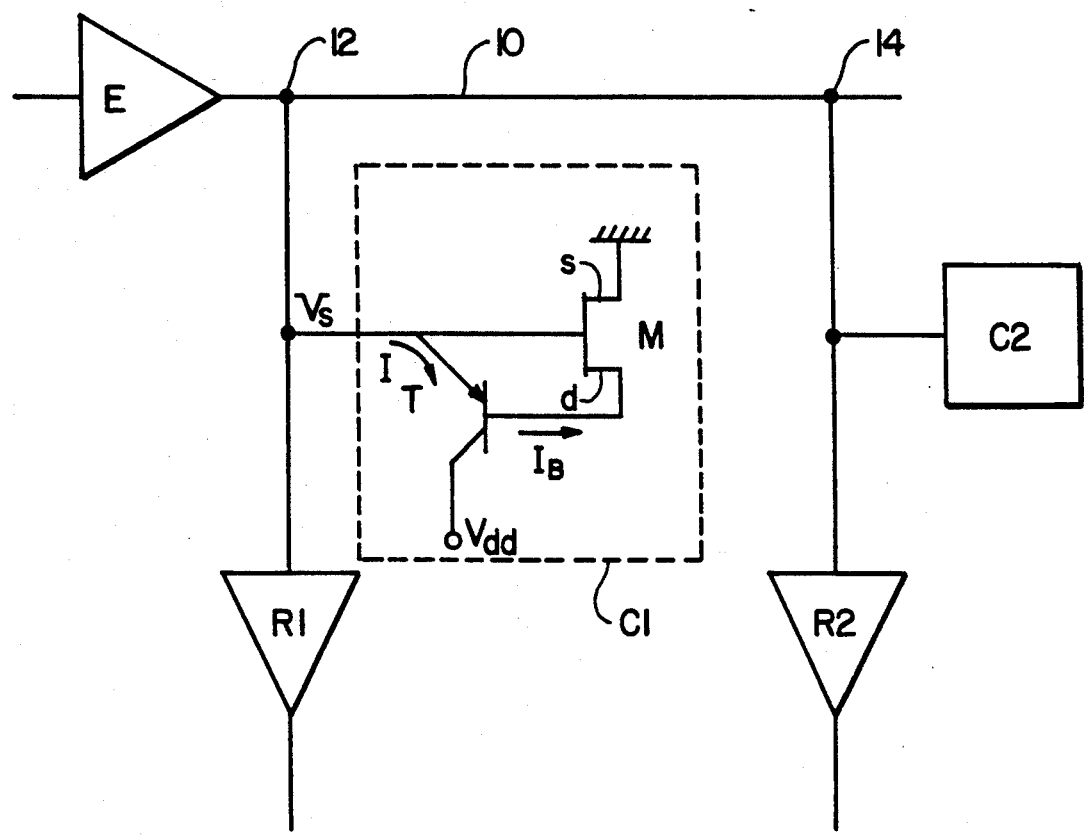
FIG. 3 is a drawing of an alternate embodiment of the peak clipping circuit of FIG. 2 wherein the charge transistor M is of the NMOS type and the bipolar transistor T is of the PNP type having its base connected to the source terminal of the charge transistor M.

FIG. 1 shows the general (schematic, voluntarily deformed) course of a voltage signal Vs representing a rectangular pulse in a transmission line connecting two integrated circuits of the VLSI type that are not equipped with peak clipping circuits. It can be noted that each pulse edge is followed by parasitic superoscillations, due to the self-inductance of the VLSI packages; this is true in particular for the trailing edge of superoscillations that are characteristic of "negative" voltages (to the extent that the level Vs="0" is representative of the zero reference voltage). As mentioned above, peak clipping of the "negative" oscillation performed with the aid of a passive diode (line VDP) is not satisfactory, insofar as the threshold voltage of this diode (VBE of approximately 0.8 V) shifts the zero reference of the circuit by −0.8 V by its construction.

FIG. 2 shows an emitter device E that furnishes a signal Vs on a transmission line 10 so that it can be received by one or more receiver or circuit devices R1, R2, such as buffer amplifiers to give a non-limiting example, disposed at the input in the VLSI-type integrated circuits. Each receiver device R1, R2 is connected independently by its input terminal 12, 14 to the transmission line 10. According to the invention, each receiver device R1 (R2) is provided with a peak clipping circuit C1 (C2), suitably mounted in parallel at the input 12 (14) of the receiver or circuit device R1 (R2) and intended, for example, to improve the "low" level (or "zero" level) of the signal Vs at this input 12 (14), in particular to eliminate the parasitic negative voltages.

The peak clipping circuit C1 is composed of a peak clipping transistor of the bipolar T type, controlled at its base by a charge transistor M of the MOS type, the gate of which is connected to the input 12. In the example shown in FIG. 2, the transistor M is of the PMOS type, the sources of which is connected to an source voltage VDD, and the drain d of which is connected to the base of the transistor T. The npn-type transistor T has its emitter connected to the input terminal 12 and its collector connected to the ground of the circuit (zero reference voltage). In the ensuing description, Vs represents the voltage level present at the input 12 of the receiver circuit R1, and consequently at the gate of the transistor M and at the emitter of the transistor T; I represents the current circulating from the emitter of the transistor T to the input 12; and IB represents the base current of the transistor T.

The peak clipping circuit C1 described above functions as follows. When the signal Vs equals "1", the positive voltage present at the gate of the transistor M blocks this transistor M. The transistor T is also blocked, such that the circuit C1 generates no current I whatever that could have an effect on the instantaneous voltage Vs at the input 12. When the signal Vs equals "0", the transistor M is unblocked. Nevertheless, as long as the voltage Vs at the input 12 remains at the zero level, the current IB remains very slight, as does the current I (limited practically to the stray or leakage current). When Vs becomes "negative" (that is, lower than the zero level), in the case of parasitic oscillation at the input 12, the variation in voltage at the gate of the transistor M brings about an increase in the current IB. The transistor T is then unblocked and produces a strong current I. The rapid increase of the current I originating in the transistor T causes a sudden return of Vs to the "0" level at the input 12.

In a practical manner, the invention is employed in particular with BiCMOS technology, in VLSI circuits that among other elements include the receiver devices R1 and R2 and their peak clipping circuits.

The invention is not limited to the treatment of parasitic oscillation around the "low" level of the circuit Vs, but is equally applicable to the "high" level. To this end, in a variant of the peak clipping circuit according to the invention the transistor M is of the NMOS type, while the transistor T, of the pnp type, has its base connected to the drain terminal of the transistor M and its emitter connected to the input terminal of the receiver device.

Due to the use of inverted types from that shown in FIG. 2 for both the charge transistor M and bipolar transistor T, as is well known to those skilled in the art, the collector of the PNP transistor T must be connected to the voltage source $V_{dd}$ and the drain of the charge transistor M must be connected to a ground or zero reference voltage as shown.

I claim:

1. A peak clipping circuit (C1) for an integrated circuit of the VLSI type including a circuit device (R1) having an input (12), means for connecting said clipping circuit with the circuit device, said clipping circuit including a peak clipping bipolar transistor (T) of the pnp bipolar type having base collector and emitter electrodes and a charge transistor (M) of the MOS type, means for connecting the base electrode to a drain terminal of the MOS-type, transistor (M), and means for connecting a gate electrode of said charge transistor and the emitter electrode of said bipolar transistor to said input (12) of the circuit device (R1), and further including a low level supply voltage (ground) connected to the source of the charge transistor (M) and a high level supply voltage (VDD) connected to the collector electrode.

2. The peak clipping circuit of claim 1 wherein the charge transistor (M) is of the NMOS type.

3. A peak clipping circuit (C1) for an integrated circuit of the VLSI type including a circuit device (R1) having an input (R), means for connecting said clipping circuit with the circuit device, said clipping circuit including a peak clipping transistor (T) of the npn bipolar type having base, collector and emitter electrodes, and a charge transistor (M) of the MOS type, means for connecting the base electrode to a drain terminal of the MOS-type transistor (M) and means for connecting a gate electrode of said charge transistor and the emitter electrode of said bipolar transistor to said input (12) of the circuit device (R1), and, further including supply voltage of a low level (ground) and a high level (VDD) connected to the collector electrode and source of the charge transistor (M) respectively.

4. The peak clipping circuit of claim 3 wherein the charge transistor (M) is of the PMOS type.

* * * * *